(12) United States Patent
Wayman et al.

(10) Patent No.: US 6,202,999 B1
(45) Date of Patent: Mar. 20, 2001

(54) WORKPIECE SUPPORT DEVICE (75) Inventors: John Charles Wayman, Dorset; Richard Wigmore, Brighton; Richard Anthony Pepper, Burgess Hill, all of (GB)

(73) Assignee: DEK Printing Machines Ltd., Weymouth (GB)

( * ) Notice: Subject to any disclaimer, the term of this patent is extended or adjusted under 35 U.S.C. 154(b) by 0 days.

(21) Appl. No.: 09/355,123

(22) PCT Filed: Feb. 11, 1998

(86) PCT No.: PCT/GB98/00426

§ 371 Date: Oct. 4, 1999

§ 102(e) Date: Oct. 4, 1999

(87) PCT Pub. No.: WO98/35780

PCT Pub. Date: Aug. 20, 1998

(30) Foreign Application Priority Data

Feb. 14, 1997 (GB) .................................................. 9703082
Feb. 9, 1998 (GB) .................................................. 9802734

(51) Int. Cl.[7] ...................................................... B23Q 3/00
(52) U.S. Cl. ........................... 269/309; 269/25; 269/266; 269/296
(58) Field of Search ................................... 269/266, 309, 269/310, 20, 25, 296

(56) References Cited

U.S. PATENT DOCUMENTS 4,506,999  3/1985  Robertson .
5,551,677  9/1996  Puettmer et al. .
5,609,377  3/1997  Tanaka .

FOREIGN PATENT DOCUMENTS

2 322 089    3/1999  (GB) .
WO 93 14907  8/1993  (WO) .
WO 95 03901  2/1995  (WO) .

Primary Examiner—Robert C. Watson (57) ABSTRACT

A workpiece support device comprises an array of rods in columns and rows with free ends of the rods forming, a support surface, in which support surface recesses can be created by selectively retracting individual ones of the rods. Each rod is coupled to a respective piston within a respective cylinder and each cylinder has an upper connection for medium pressure, a lower connection for high pressure and a middle connection for low pressure. A trigger piston is provided in a cylinder below the piston. The rod can be caused to extend from the cylinder by applying low pressure to the connection to press the trigger piston downwardly to close the high pressure connection. Such low pressure passes around the lip of a lip seal on the trigger piston and through a connection pressurises the underside of the piston to raise the piston and release it from pressing the trigger piston downwardly. Subsequently pressurising the connections and causes the differential pressure to force the piston upwardly. However by sequencing the application of pressure to the connections the rod can be locked in the retracted position. Medium pressure applied to the upper connection which presses the piston downwardly to abut the trigger piston and hold it in a depressed condition in which it will remain even after pressure is restored to the high pressure connection.

13 Claims, 12 Drawing Sheets

WORKPIECE SUPPORT DEVICE

FIELD OF THE INVENTION

The present invention relates to the field of workpiece support devices. More particularly, the present invention provides a workpiece support device that enables an active creation of support surface recesses while enabling a very compact arrangement of the supporting rods.

BACKGROUND OF THE INVENTION

A workpiece support device can be formed by utilizing a plurality of parallel rods or pins, provided in an array of columns and rows with free ends of the rods or pins lying either in a plane which defines a support surface or alternatively retracted therefrom to form a recess in the support surface. A workpiece on which an operation is to be performed can be supported by the support surface even though it has projections or irregularities on the face which is towards the support surface since such projections or irregularities can be accommodated in the recesses formed by retracted ones of the rods. The workpiece may, for example, be a printed circuit board which already carries circuit components on one side thereof and the other side of which is to have an operation effected thereon such as a printing operation, solderflow to secure the circuit components in place or affixing of further circuit components.

In one embodiment of a device utilizing the prior art, the non-free end of each rod is coupled to a respective piston within a respective cylinder, with all cylinders in each row having their upper ends connected to a pressure source and their lower ends connected to a pressure source, both sources controlled by one respective solenoid valve, and with each rod controlled by a control means.

OBJECTS AND SUMMARY OF THE INVENTION

It is therefore an object of the present invention to provide for an improved workpiece support device. Furthermore, since a very large number of rods may be desirable, it is another object of the present invention to locate individual rods and mounting and moving means close together. Another object of the present invention is to provide for an array of support rods which can be set to an advanced position or a retracted position rapidly and reliably.

According to the invention, a workpiece support device comprises an array of rods in columns and rows with the free ends of the rods forming a support surface, in which support surface, recesses can be created by selectively retracting individual ones of the rods; wherein each rod is coupled to a respective piston within a respective cylinder, all the cylinders in each row have their upper ends connected to a medium pressure source via a common row valve and their lower ends connected to a high pressure source via a further common row valve; wherein a trigger piston is provided in the lower end of each cylinder and is movable between a raised position in which it allows the high pressure source to feed the bottom of the cylinder and a lowered position in which it closes off the feed from the high pressure source and allows feed to the bottom of the cylinder from a low pressure source connected to the bottom of the cylinders of each column by a common column valve; wherein each piston can be locked in an advanced position by differential pressure between the medium and high pressure sources and can be locked in a retracted position by causing that piston to hold the respective trigger piston in the lowered position.

The pressure sources are preferably pneumatic and, by choosing a suitable sequence of application of pressure to the upper end of the cylinder and the lower end of the cylinder from the low, medium and high pressure sources by the respective common column valves and common row valves, the pistons of the rows and columns can be set individually to advanced or retracted positions as desired.

Preferably, the common row valves feeding the upper ends of the cylinders and the common row valves feeding the lower ends of the cylinders are normally open valves and the common column valves feeding the lower ends of the cylinders are normally closed valves. Each common row valve, when not in its normal position, vents the portion of the cylinder to which it is connected to atmosphere.

The device can be set for a desired shape of workpiece by setting the cylinders of the rows individually and sequentially until all the rows required for the workpiece are set. Each row is set by energizing the common row valve supplying the upper end of the cylinders and the further common row valve supplying the lower end of the cylinders (thereby depressurizing the areas of the cylinder to which they are connected) and energizing the common column valve corresponding to cylinders required to be extended (thus applying air pressure to the lower end of the cylinder from the low pressure source). Such air applied by the common column valve depresses the trigger piston and raises the cylinder piston to the extended position of the rod. When the air pressure applied to the common column valve is removed and air pressure is again applied to the upper and lower row connections through the common row valve and the further common row valve, the high pressure to the lower connection raises the trigger piston and is applied to the underside of the main piston to force the rod to a fully extended position due to the differential pressure between the medium pressure source and the high pressure source.

In the columns in which the rod is not to be extended, the common column valve connected to the low pressure source at the lower end of the cylinder is not opened, the main piston is therefore not raised, and when the common row valve connected to the medium pressure source is opened, the main piston is forced downwardly and depresses the trigger piston closing the high pressure connection. The high pressure, when reconnected, is insufficient to raise the trigger piston against the downward force applied by the medium pressure to the main piston and the rod remains in the retracted position.

All cylinders may be reset to the retracted position by exhausting all the bottom connections while maintaining the air supply to the top connections and the pistons can then be set to advanced position or maintained in retracted position as desired. By the choice of valve types (either normally open or normally closed), it can be arranged so that when all the valves are de-energized, the apparatus maintains its current set up.

BRIEF DESCRIPTION OF THE DRAWINGS

Other features, characteristics and advantages of the present invention will appear to the person of ordinary skill in the art in view of the detailed description below made with reference to the annexed drawings, in which like reference numerals refer to like elements, and in which:

FIG. 4 shows the cylinder in a locked up position;

FIGS. 3a to 9a respectively show the arrangement and position of a trigger piston provided in the cylinder for each of the conditions of FIGS. 3 to 9.

DETAILED DESCRIPTION OF THE DRAWINGS

Figure 1:
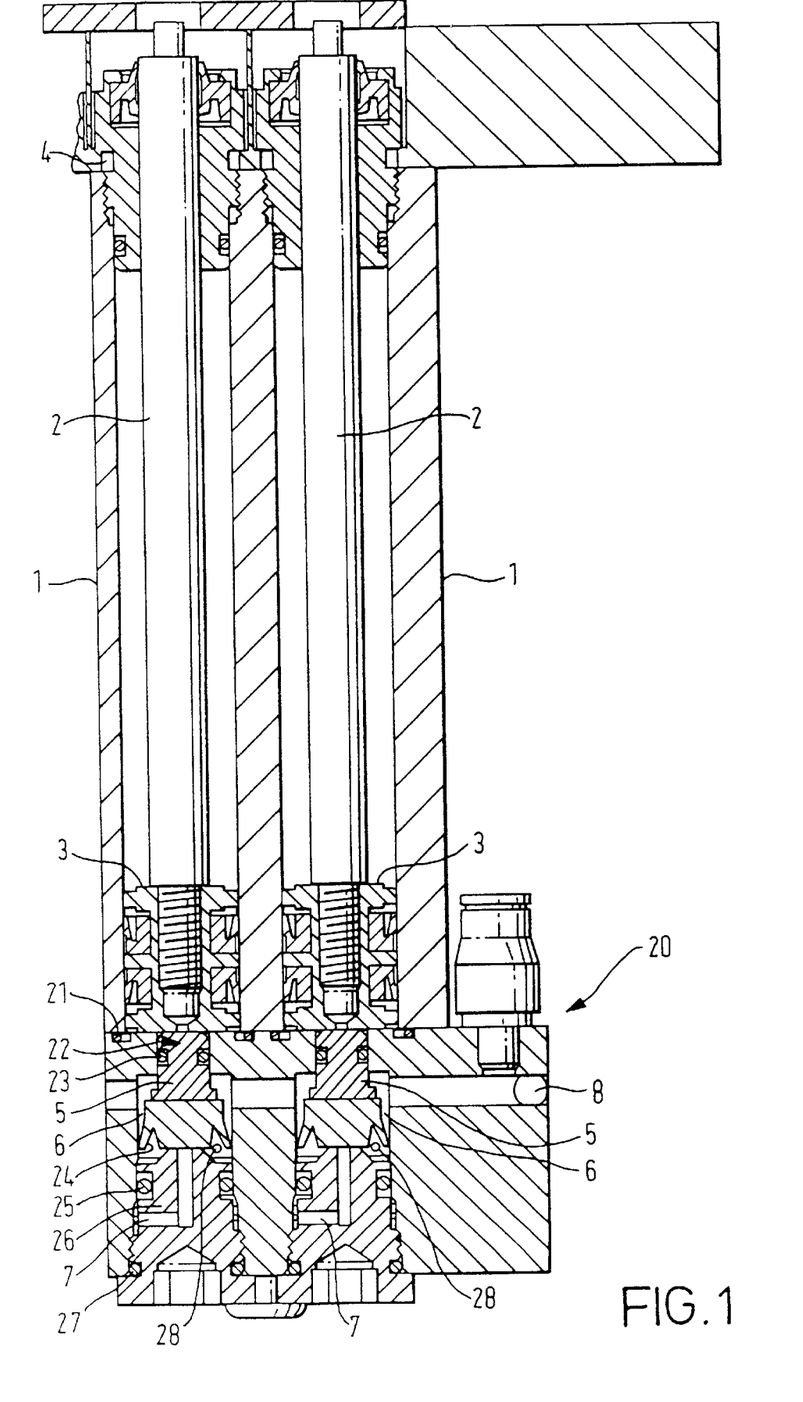
FIG. 1 is a sectional illustration of two adjacent cylinders of a workpiece support device according to the invention.

Referring to the drawings and firstly to FIG. 1, each of the two cylinders 1 shown has a piston rod 2 therein mounting a piston 3 at its lower end. The usual seals are provided. At the upper end there is an inlet connection 4. At the lower end, below the piston 3, a trigger piston 5 is provided aligned with the rod 2 and the piston 3 of the cylinder 1 but contained within its own cylinder 6. The bottom end of the piston 3 can abut the top end of the trigger piston 5. A high pressure connection 7 is provided to the underside of the trigger piston 5 and a low pressure connection 8 is provided to the upperside of the trigger piston 5.

Figure 2:
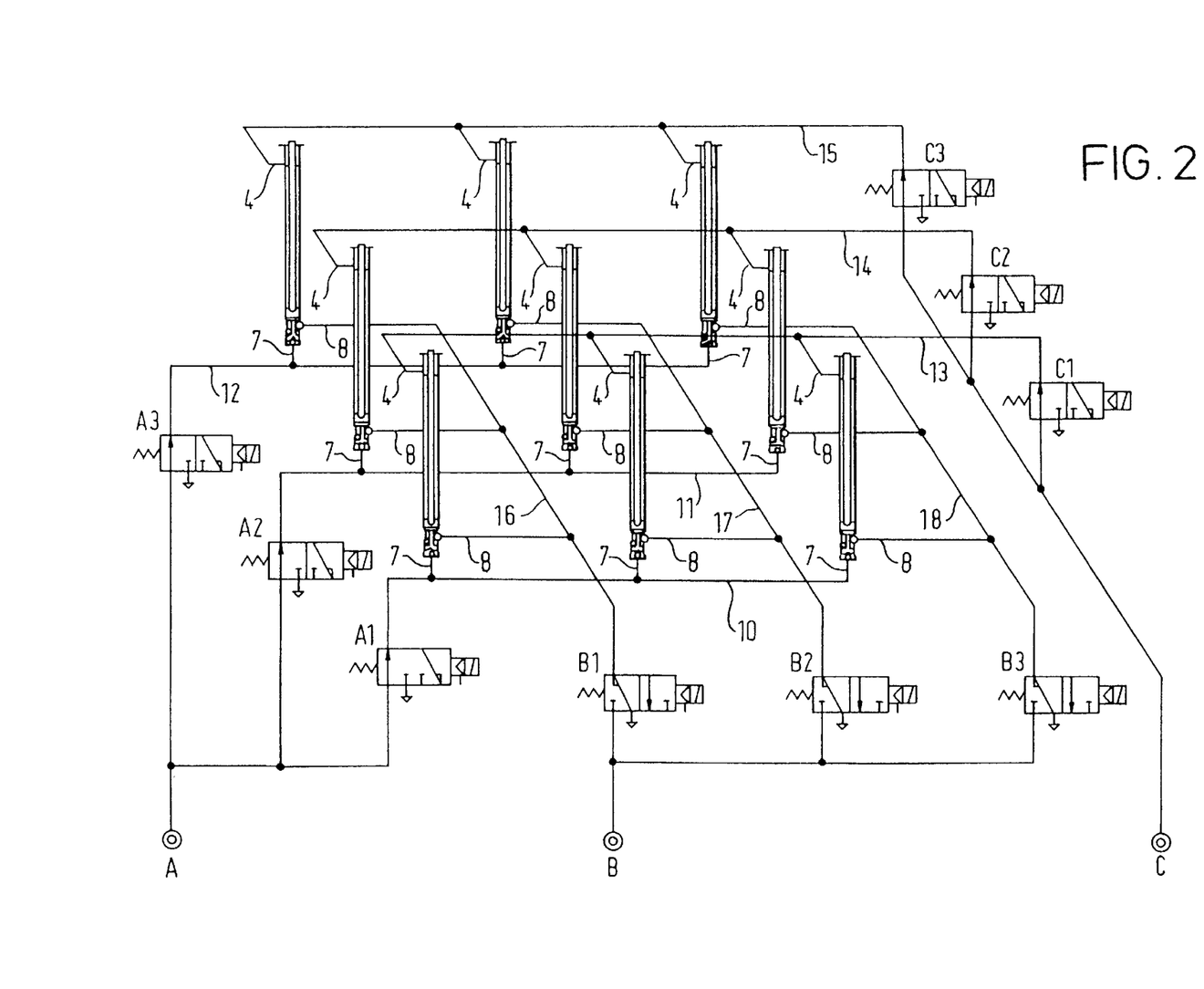
FIG. 2 is a schematic diagram showing pneumatic connections to an array of pneumatic cylinders in three rows and three columns forming a workpiece support device according, to the invention.

Referring to FIG. 2, nine of the cylinders 1 are shown in an array of three rows and three columns. The high pressure connections 7 of the bottom row are connected to a line 10 which is connected to a high pressure source A, for example 10 bar, by a normally open valve A1. Likewise, a line 11 connects the connections 7 of a middle row of the cylinders 1 via a valve A2 to the high pressure source A, and a line 12 connects the connections 7 of the upper row of cylinders to the high pressure source A via a valve A3.

In a similar manner, the connections 4 at the upper ends of the cylinders of the bottom row are connected to a line 13 which is connected to a medium pressure source C via a normally open valve C1. Likewise, a line 14 connects the connections 4 of the middle row via a valve C2 to the source C, and a line 15 connects the connections 4 of the upper row via a valve C3 to the source C.

The connections 8 at the lower end of the cylinders above the trigger pistons 5 of the left-hand column of the cylinders 1 are connected by a line 16 and by a normally closed valve B1 to a source of low pressure B; the connections 8 of the cylinders 1 of the middle row by a line 17 and by a valve B2 to the source B; and the connections 8 of the right-hand column by a line 18 and by a valve B3 to the low pressure source B.

Thus, for example, the high pressure source A is normally applied to the connections 7 of the cylinders but can be selectively cut off row by row by individually operating, i.e. closing, the valves A1, A2, A3. Likewise, the medium pressure source C is normally applied to the upper ends of the cylinders 1 but can be selectively cut off row by row by individually operating, i.e. closing, the valves C1, C2 and C3. The low pressure from the source B is not normally applied to the upper ends of the trigger pistons 5 of the cylinders 1 but can be applied thereto column by column by selectively operating, i.e. opening, the valves B1 and B2 and B3.

Figure 3:
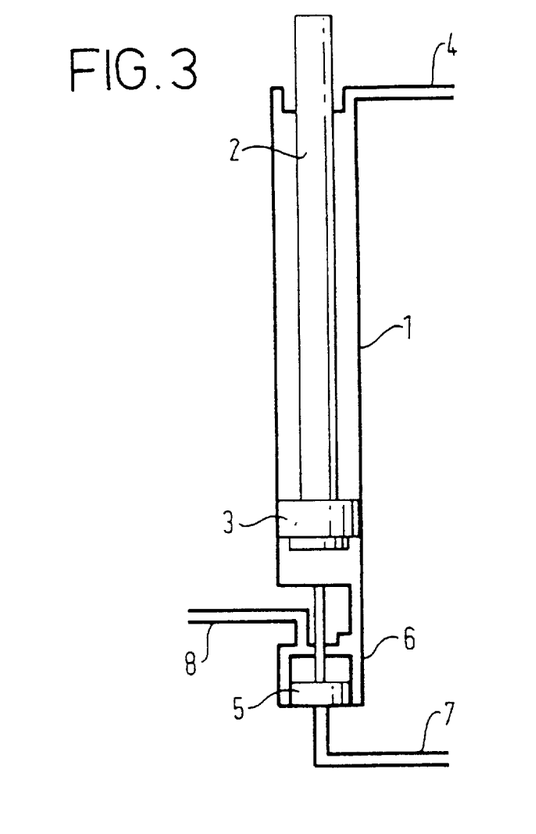
FIG. 3 is a view showing one of the cylinders of the array of FIG. 2.

Referring to FIG. 3, the components described with reference to FIG. 1 of a piston cylinder arrangement can be seen; particularly, the cooperating piston 3 and trigger piston 5, and the low pressure connection 8, the medium pressure connection 4 and the high pressure connection 7.

Figure 3A:
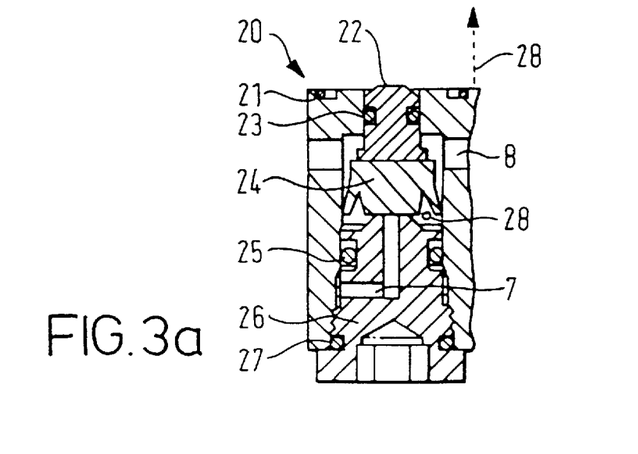

In FIGS. 1 and 3a there can be seen an interpilot mechanism 20 comprising not only the trigger piston 5 in its cylinder 6, but also an interpilot lip seal 24 which acts in the bore of the cylinder 6 and can move longitudinally therein with low friction. The remainder of the trigger piston 5 is formed by a push pin 22 sealed by an 'O' ring 23 in a bore which extends between the cylinder 6 and the main cylinder 1. Below the interpilot lip seal 24 is an orifice plug 26 sealed by an 'O' ring 25 above the high pressure connection 7 and by an 'O' ring 27 below the high pressure connection 7. An 'O' ring 21 (also shown in FIG. 1) seals the interpilot mechanism 20 to the lower end of the main cylinder 1. A connection 28 leads from below the interpilot lip seal 24 to the bore of the cylinder 1. The orifice plug 26 is screwed into the cylinder 6 from below and sealed by the two 'O' rings 25,27. After the plug 26 has been removed, the lip seal 24 and push pin 22 can readily be removed together with the 'O' ring seal 23.

Figures 4, 4A:
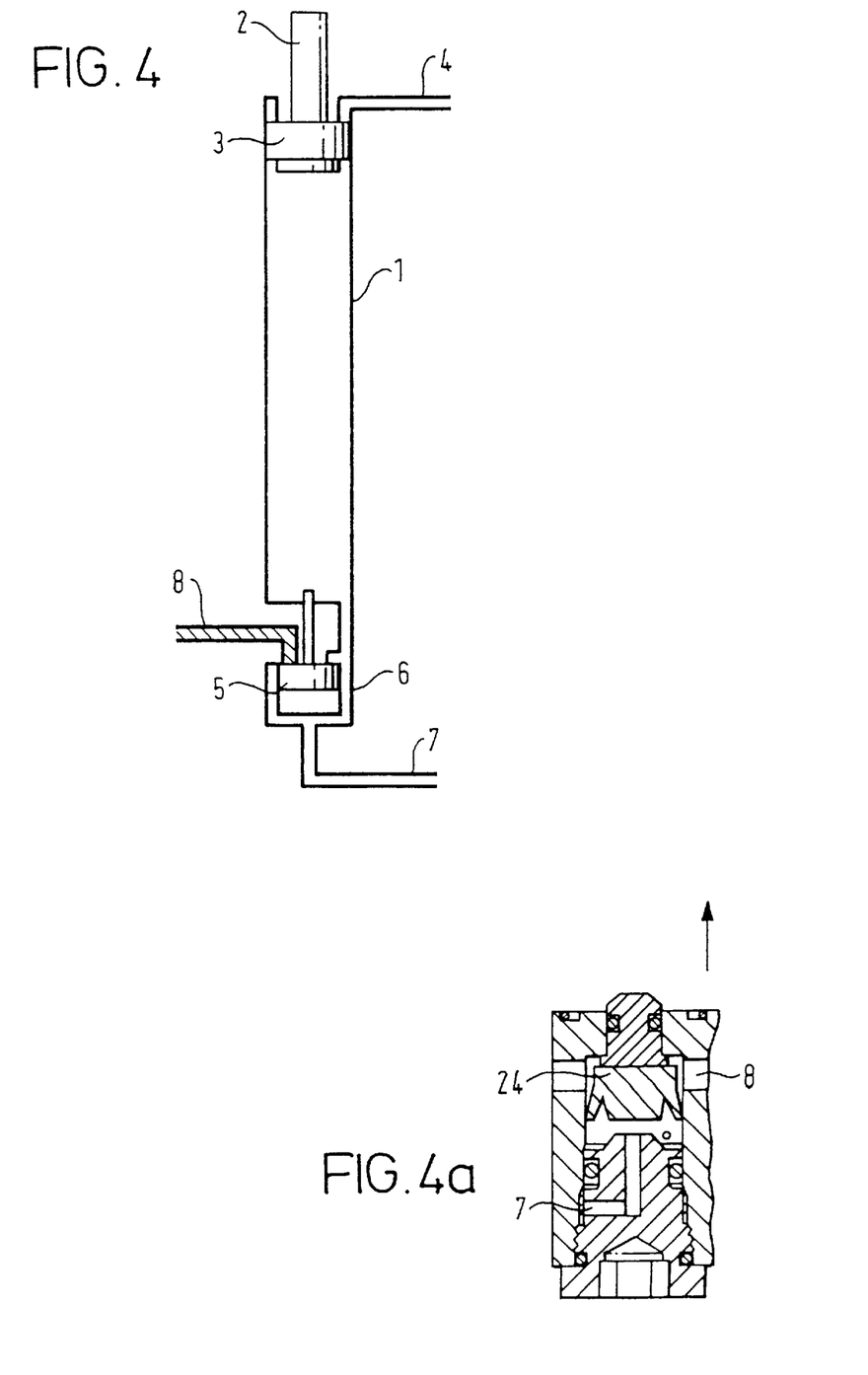
Figure 5:
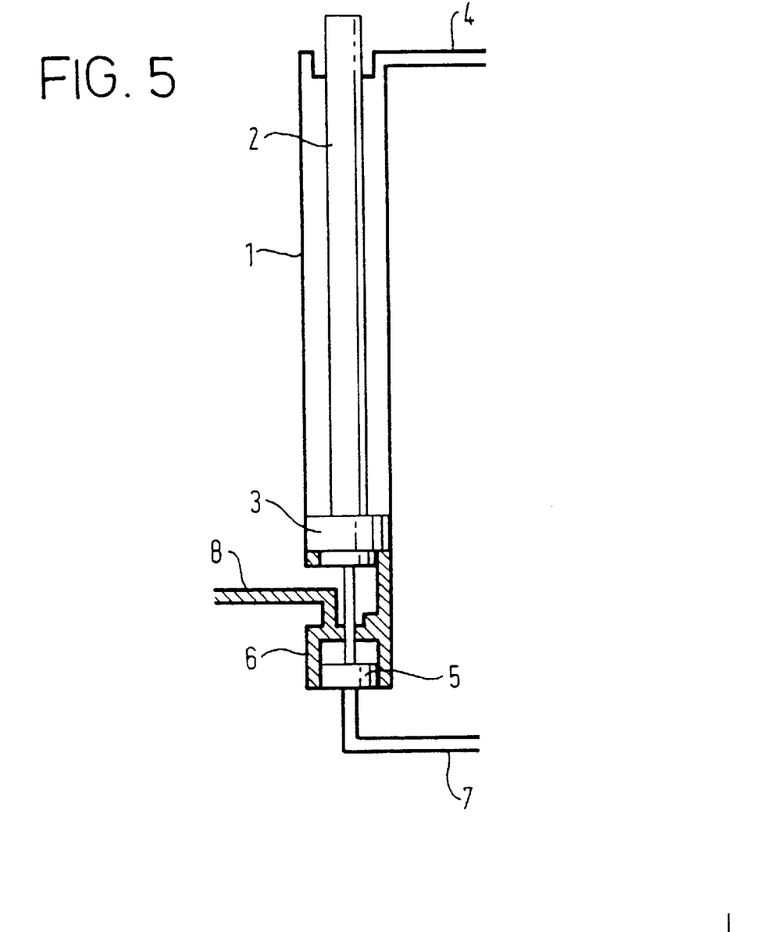
FIG. 5 shows the cylinder in a locked down position.
Figure 5A:
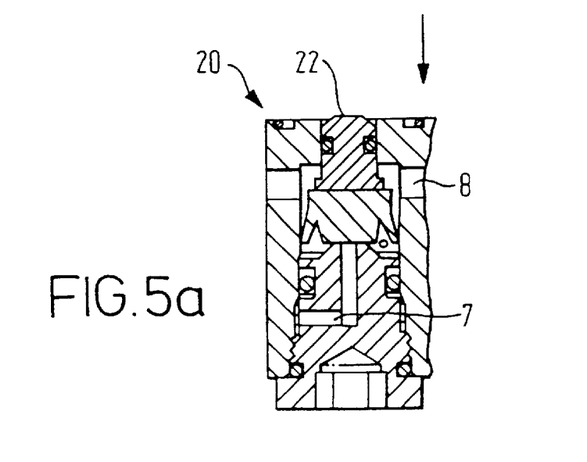

FIG. 4 shows that the piston cylinder arrangement can be locked up, i.e., held locked in the piston advanced position, by applying pressure to both the connections 4 and 7, regardless of whether pressure is applied to the connection 8. Likewise FIG. 5 shows that the piston cylinder arrangement can be locked down, i.e., held locked in the piston retracted position, by applying pressure to the connections 4 and 7, again regardless of whether pressure is being applied to the connection 8. Thus, it depends upon the sequence of the application of pressure to the three connections of each cylinder which moves the cylinder to the advanced or to the retracted position and once it has achieved that position it will be held therein by application of pressure to the connections 4 and 7.

Thus, if pressure is first applied to the connection 4, the piston 3 will move downwardly and apply downward pressure to the push pin 22 to press the lip seal 24 against the orifice plug 26. This closes the connection 7 and prevents the high pressure from reaching the main piston bore. The compression of the interpilot seal 24 produces a reactive-"spring" force which, when released, assists with moving the piston 3 via the pin 22 when it is signaled to lift.

Lifting of the piston 3 and rod assembly is achieved by applying pressure to the connection 8. By the nature of the interpilot seal 24, air can flow around the outside of the seal 24 compressing the lip radially inwards and allowing the air to connect with the lower side of the piston 3 via the connection 28. This pressure, and the force generated by the seal compression, drive the piston 3 and rod upwards toward the locked up position of FIG. 4.

At the same time, the high pressure is also acting on the lower face of the interpilot seal 24 and this pushes the interpilot seal 24 away from the orifice plug 26 seat allowing the high pressure air to enter the piston bore via the connection 28. The high pressure has two further effects: 1) it expands the lip of the interpilot seal 24 which effectively reseals the connection 8 and prevents the high pressure air from entering the upper chamber of the cylinder 6; and 2) it allows the high pressure air to act on the full lower face of the interpilot seal 24 to drive the mechanism upward under power. In this way, high forces act on the interpilot seal 24 in both the locked up and locked down positions substantially reducing the chance of frictional errors occurring.

Figure 6:
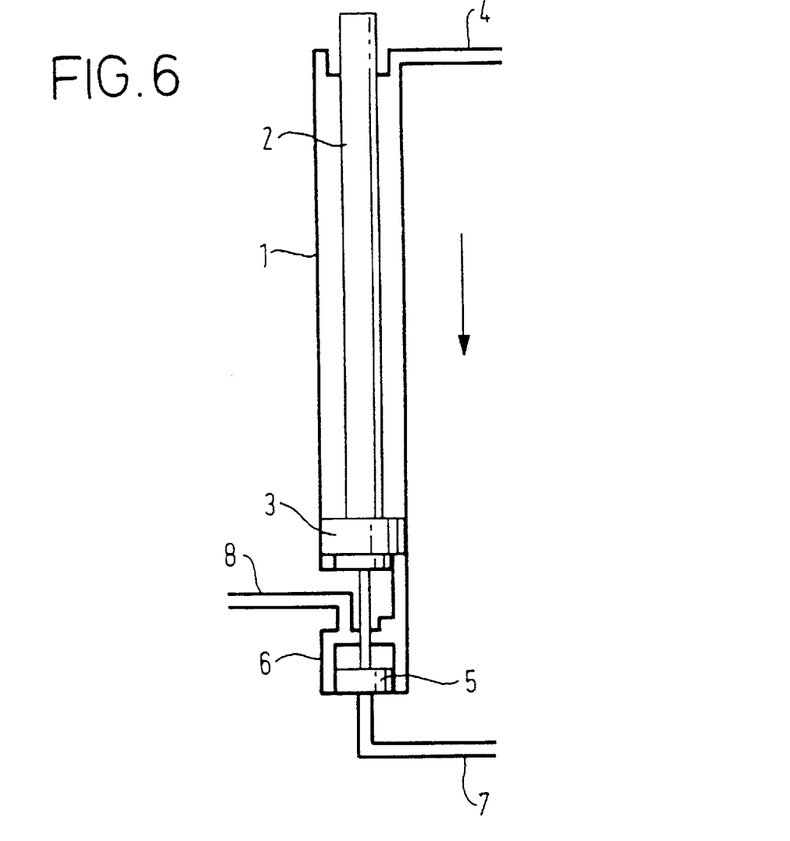
FIG. 6 shows the cylinder in a resetting condition.
Figure 6A:
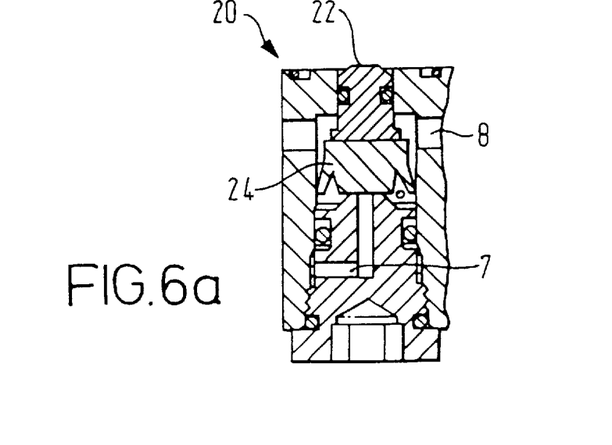

FIG. 6 shows that a piston cylinder arrangement can be reset to the retracted position by applying pressure to the connection 4, with the connections 7 and 8 being open to atmosphere. Thus, resetting of the piston 3 and rod assembly is achieved in that the exhaust air initially passes through to the orifice of the interpilot plug 26 (now set at zero pressure) and finally via the upper chamber of the cylinder 6 (now set at 0 bar). The latter is possible since the interpilot lip seal 24 overlaps the hole of the connection 28 effectively by-passing the interpilot seal 24. From the position of FIG. 6, any piston cylinder arrangement in the array can be set to the advanced position by the sequence of operations shown in FIGS. 7, 8 and 9 or alternatively can be set to the retracted position. Overall, the workpiece holding device can be set for a particular workpiece by setting one row of cylinders at a time sequentially until all the rows required for the workpiece are set.

Figure 7:
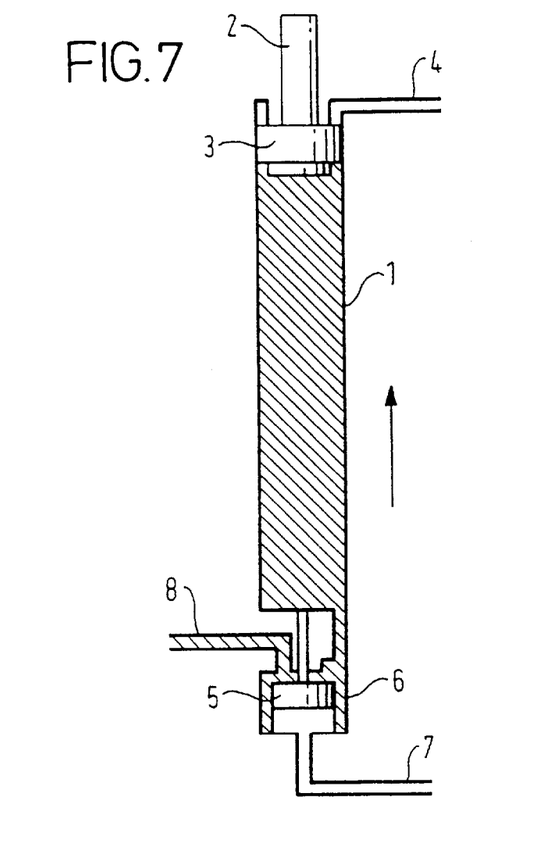
FIGS. 7, 8 and 9 show successive steps in a setting operation to set the piston of the cylinder in a raised position.
Figure 7A:
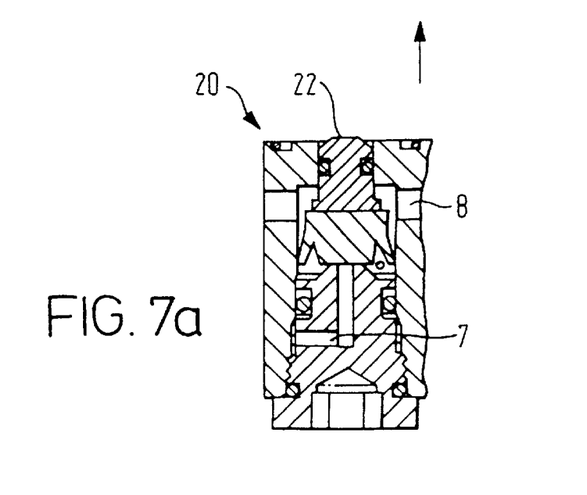
Figure 8:
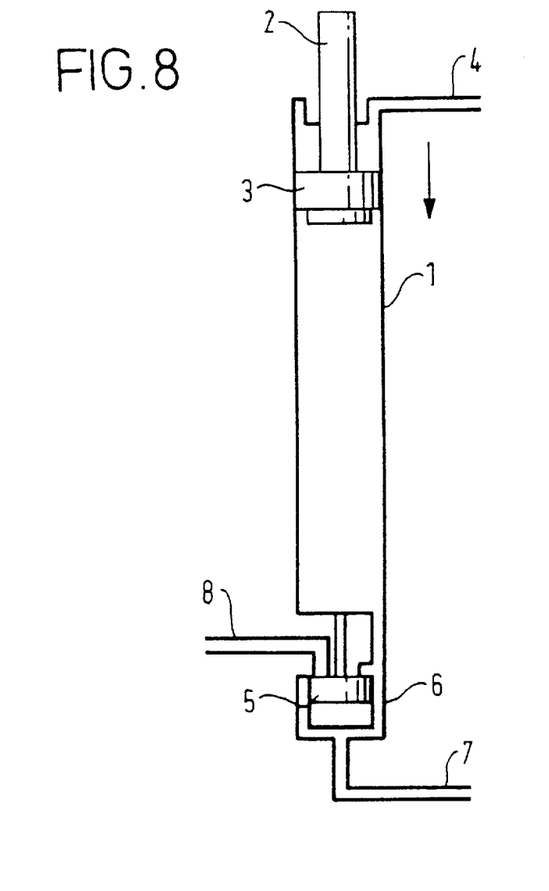
Figure 8A:
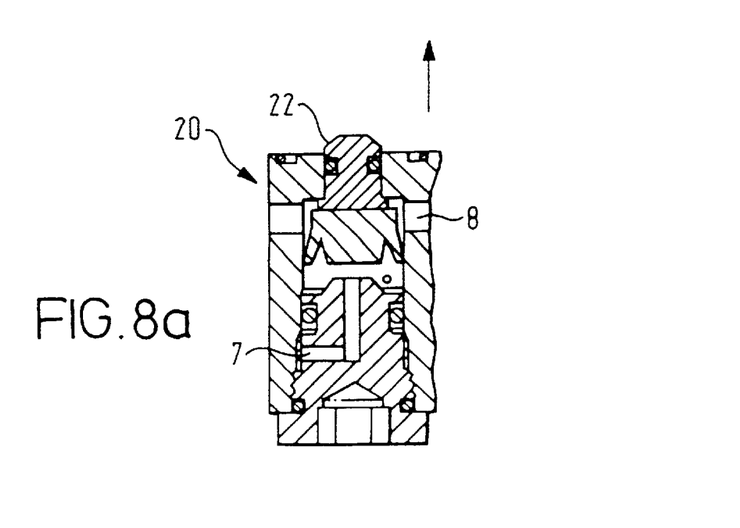
Figure 9:
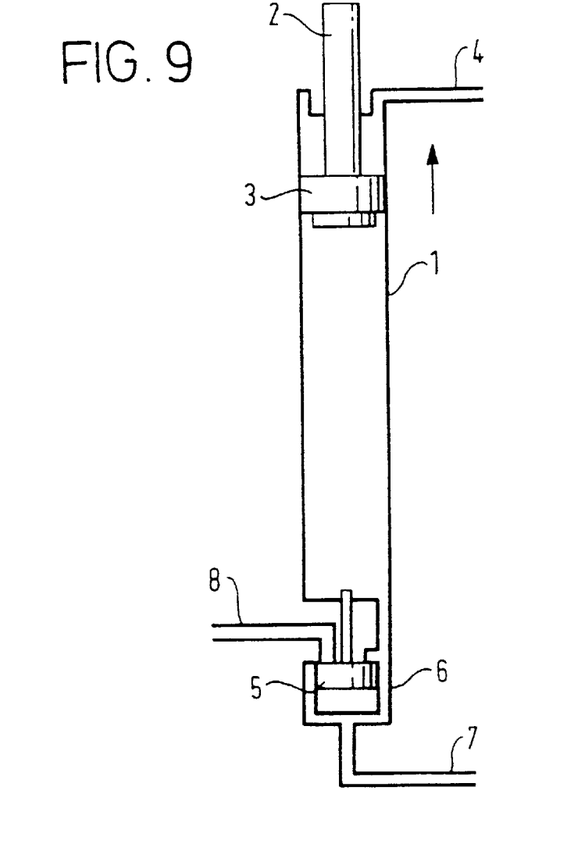
Figure 9A:
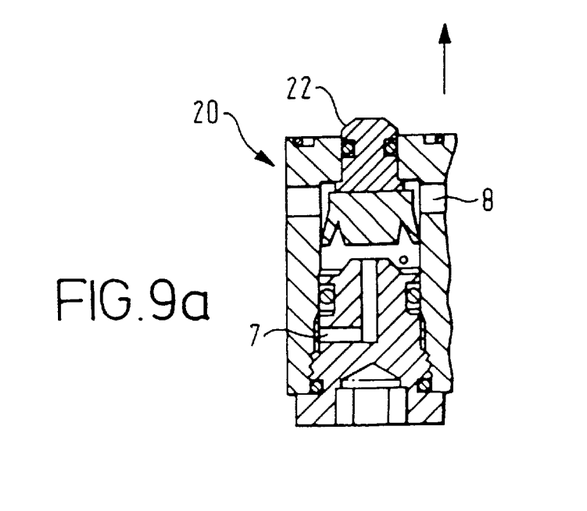

With reference to FIG. 7, to set a cylinder to the advanced position, the valves A and C are first energized to remove the pressure sources from the connections 4 and 7 and open them to atmosphere. Pressure is applied by opening the respective column valves to cause the source B to supply pressure to the connection 8. This pressure passes around the edge of the lip seal 24 and through the connection 28 to the underside of the piston 3 to raise the piston 3 and the rod 2 to the advanced position as shown by the arrow. As shown in FIG. 8, de-energization of the respective valve feeding the connection 4 applies pressure to the connection 4 to start the piston 3 moving downwardly, but, as shown in FIG. 9, de-energization of the valve feeding the connection 7 applies pressure to the connection 7, and via the connection 28, rapidly moves the piston 3 upwardly to the locked up position of FIG. 4.

Figure 10:
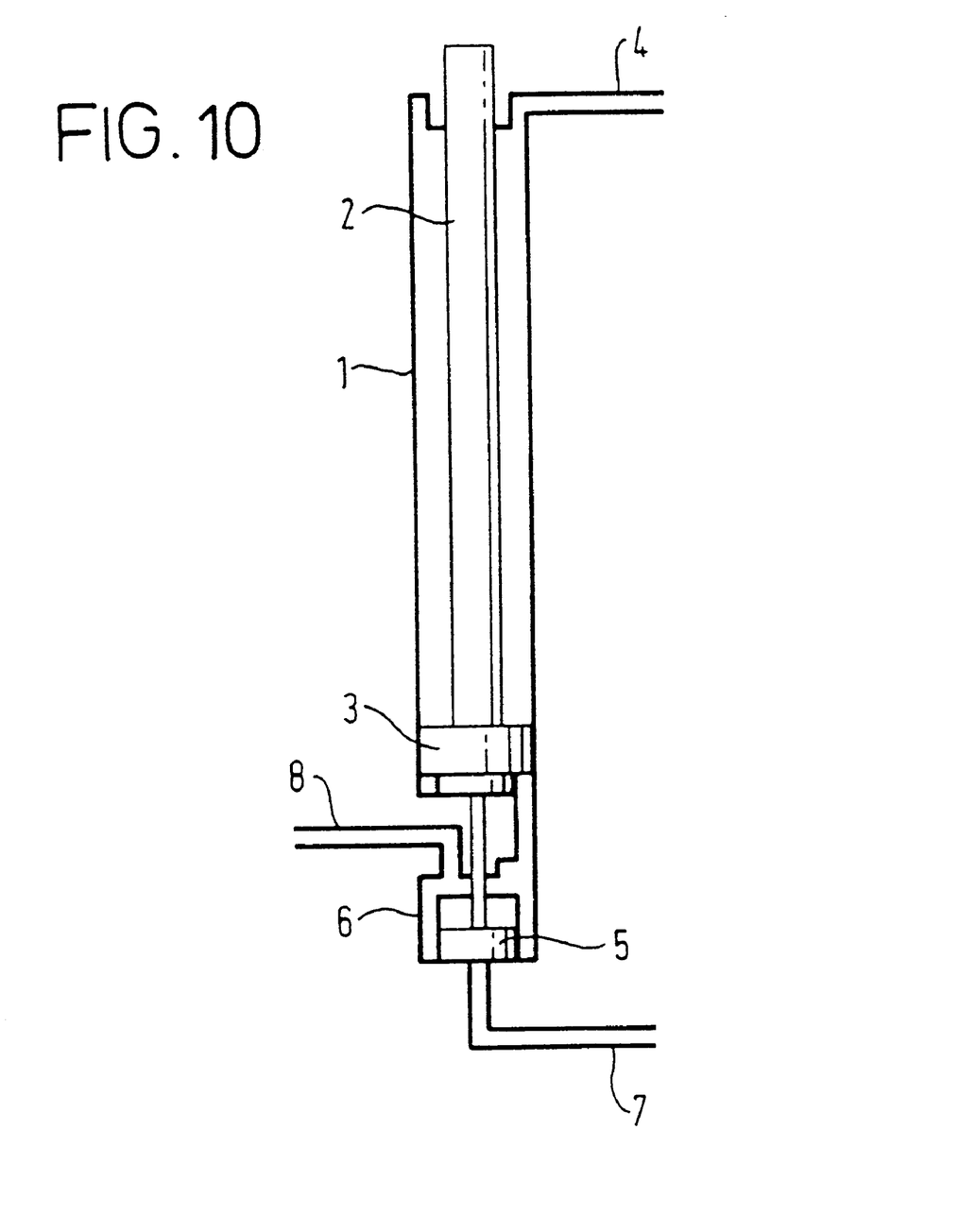
FIGS. 10, 11 and 12 show successive steps to set the cylinder with the piston in a down condition.
Figure 11:
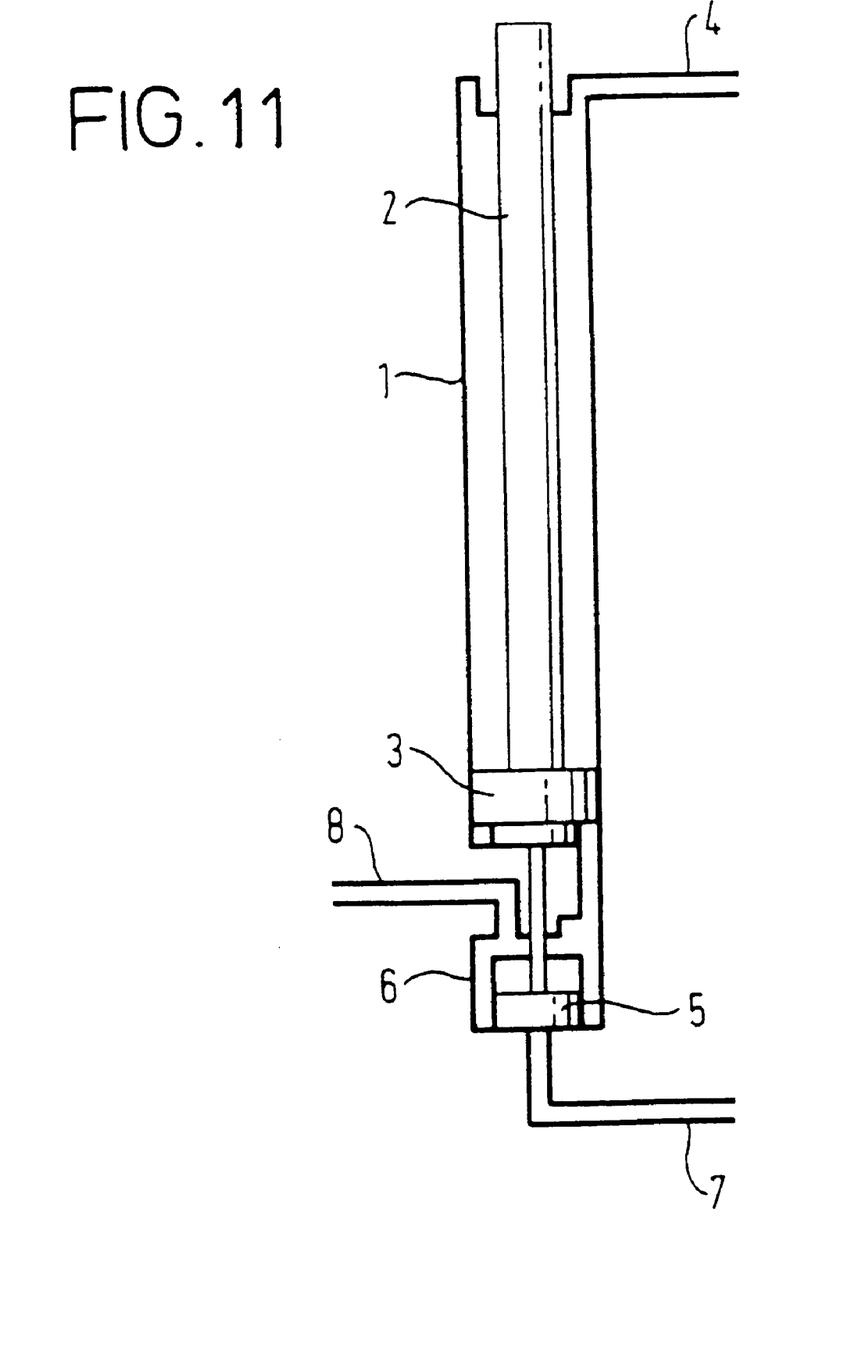
Figure 12:
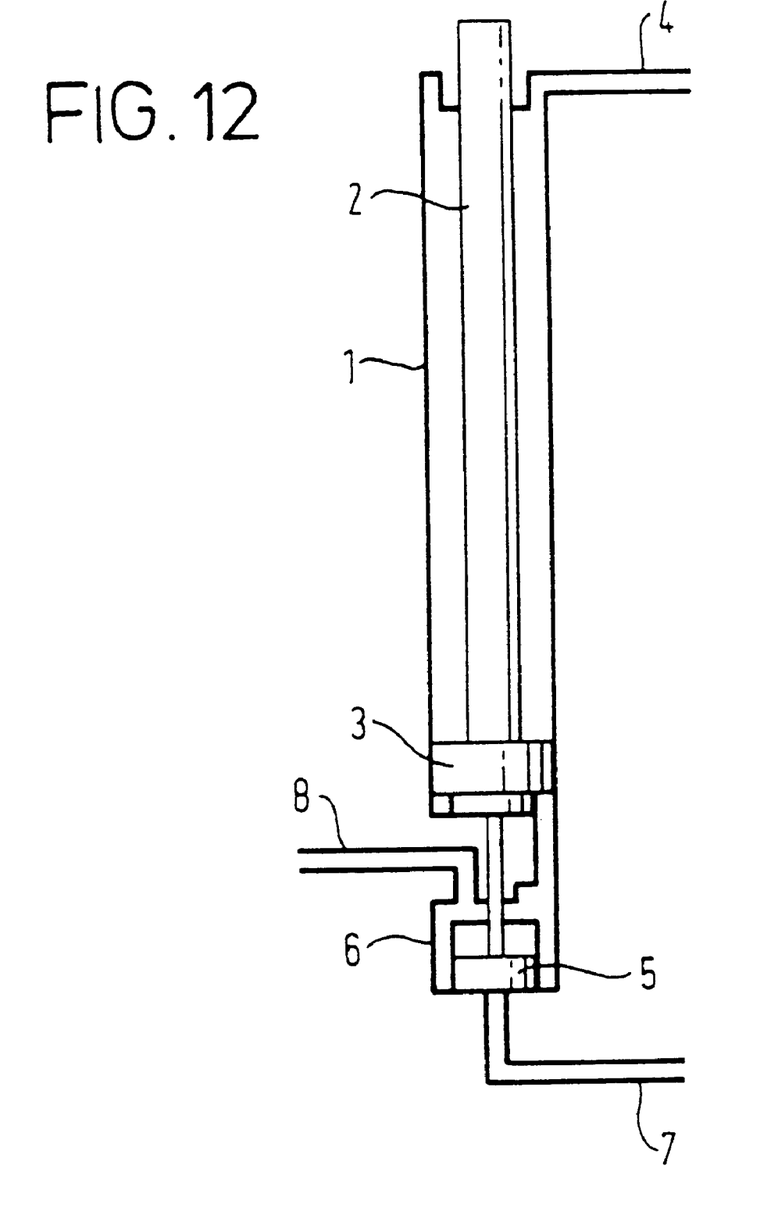

To set a piston 3 to the retracted position, after valves A and C are energized, as described below, valve B is connected with atmosphere so that pressure is not applied to the connection 8 and the piston remains retracted, as shown in FIG. 10. Valve A is then de-energized, applying the medium pressure to connection 4 and forcing piston 3 downwardly to engage the trigger piston 5 thereby closing the pressure input from the connection 7. When the pressure is reapplied to the connection 7 the piston is maintained in the downward position, as shown in FIG. 10, since the force of the high pressure connection acting on the small area of the underside of the trigger piston 5 is insufficient to overcome the action of lower pressure from connection 4 acting on the much larger area of the upperside of the piston 3.

Thus, the cylinders of the rows are sequentially set to desired positions, and as each row is set, its cylinders are locked into position by the application of air at high pressure to the lower connection 7, and air at medium pressure to the top connection 4, the middle connection being exhausted to atmosphere. Since the base of each retracted piston 3 touches the top of the trigger piston 5 at the base of the cylinder 1, it pushes it down to seal off the entry of air at the high pressure connection 7. Since the pistons which are extended do not touch the respective trigger piston 5, the respective trigger piston 5 is forced upwardly and the high pressure from the connection 7 is applied via the connection 28 to the underside of the piston 3 to retain it in the advanced position. When desired, all the cylinders can be reset to the retracted position by exhausting the connection 8 and the connection 7 while applying pressure to the connection 4.

While the device has been described as if in an orientation in which the free ends of the rods form a horizontal surface facing upwardly on which a workpiece can be supported, this has been done merely for ease of description. The orientation of the device is not so limited but could be any other orientation and terms such as "upper" and "lower" which have been used in the description for convenience should be amended accordingly to reflect the changed orientation. Any number of rows and columns can be used to obtain a support surface of a desired size and shape, and as described the number of valves required will be twice that of the number of rows plus the number of columns.

What is claimed is:

1. A workpiece support, comprising:
   a plurality of drive cylinders arranged in rows and columns, each drive cylinder including an upper drive port and a lower drive port;
   a plurality of control cylinders, each arranged adjacent a respective one of the drive cylinders and each including an upper control port, a lower control port and an outlet port, the outlet port connected with the lower drive port of the respective drive cylinder;
   a plurality of drive pistons slidingly engaged in respective ones of the drive cylinders and moveable between an extended position and a retracted position;
   a plurality of trigger pistons slidingly engaged in respective ones of the control cylinders and moveable from a first position, wherein the outlet port is connected with the upper control port, and a second position, wherein the outlet port is connected with the lower control port;
   at least one lower row control valve adapted to connect the lower control ports of control cylinders adjacent drive cylinders in a respective row of drive cylinders with a fluid at a first pressure;
   at least one upper row control valve adapted to connect the upper drive ports of drive cylinders in a respective row of drive cylinders with a fluid at a second pressure; and
   at least one column control valve adapted to connect the upper control ports of control cylinders adjacent drive cylinders in a respective column of drive cylinders with a fluid at a third pressure.

2. The workpiece support according to claim 1, further comprising a plurality of push pins disposed between respective ones of the trigger pistons and the adjacent drive cylinders and each adapted to force the trigger piston to the first position when the respective drive piston is in the retracted position.

3. The workpiece support according to claim 2, wherein the first pressure is higher than the second pressure and the second pressure is higher than the third pressure.

4. The workpiece support according to claim 3, wherein the upper and lower row control valves are normally open valves and wherein the column control valves are normally closed valves.

5. The workpiece support according to claim 4, wherein, when the upper and lower row control valves and the column control valves are not in their normal positions, the ports connected thereto are connected to atmosphere.

6. The workpiece support according to claim 1, wherein the fluid is a gas.

7. A method for supporting a workpiece comprising:
   providing a plurality of drive pistons slidably engaged in a respective plurality of drive cylinders and adapted to move between an extended and a retracted position;
   providing plurality of control cylinders, each arranged adjacent a respective one of the drive cylinders, each including an upper control port, a lower control port and an outlet port, wherein the outlet port of each control cylinder is connected with a lower end of the adjacent drive cylinder;
   providing a plurality of trigger pistons slidably engaged in the control cylinders and moveable between a first position, wherein the upper port of the control cylinder is connected with the outlet port and the lower port is closed and a second position, wherein the lower port of the control cylinder is connected with the outlet port, and wherein the trigger pistons each include a push pin adapted to engage with the drive piston in the adjacent drive cylinder when the drive piston is in the retracted position to force the trigger piston to the first position;

first connecting upper ends of a selected plurality of drive cylinders and lower ports of the control cylinders adjacent the selected plurality of drive cylinders to atmosphere;

second connecting the upper port of the control cylinders adjacent a first drive cylinder of the selected plurality of drive cylinders with a fluid at a low pressure, wherein the drive pistons in the first drive cylinder is driven to the extended position;

third connecting the upper ends of the control cylinder adjacent a second drive cylinder of the selected plurality of drive cylinders to atmosphere, wherein the drive piston in the second drive cylinder is in the retracted position and the respective trigger piston is in the first position;

fourth connecting the lower ports of the control cylinders adjacent the first selected plurality of drive cylinders with a fluid at a high pressure and connecting the upper ends of the selected plurality of drive cylinders with a fluid at a medium pressure, wherein the drive piston in the first drive cylinder is forced in the extended position and the drive piston in the second drive cylinder is forced in the retracted position.

8. The method according to claim 7, further comprising fifth connecting upper ends of a next selected plurality of drive cylinders and lower ports of control cylinders adjacent the next selected plurality of drive cylinders to atmosphere and repeating the steps of second, third, and fourth connecting.

9. The method according to claim 8, wherein the drive cylinders and adjacent control cylinders are arranged in an array of rows and columns.

10. The method according to claim 9, wherein the selected plurality of control cylinders and the next selected plurality of control cylinders comprise columns of control cylinders.

11. The method according to claim 7, wherein the first and second drive cylinders are selected to correspond to features on a surface of the workpiece.

12. The method according to claim 7, further comprising:
resetting the drive pistons by connecting upper ends of the drive cylinders with the fluid at the medium pressure and connecting upper and lower ends of the control pistons to atmosphere, wherein the drive pistons are driven to the retracted position.

13. A method for supporting a workpiece comprising:
providing a plurality of pneumatic pistons adapted to move between a retracted and an extended position when relatively higher pneumatic pressure is applied to upper and lower ends, respectively, thereof;

providing plurality of pneumatic switches adapted to connect lower ends of respective ones of the pneumatic pistons to first and second ports, wherein the switches are driven mechanically by the respective piston, wherein, when the respective piston is in the retracted position, the respective piston is connected with the first port and, when the respective piston is not in the retracted position the respective piston is connected with the second port;

first connecting upper ends of the pistons and second ports with atmosphere;

second connecting the first port of a selected switch with a low pneumatic pressure, wherein the piston connected with the selected switch is drive to the extended position;

third connecting the first port of a further selected switch with atmosphere, wherein the piston connected with the further selected switch is in the retracted position;

fourth connecting upper ends of the pistons with a medium pneumatic pressure;

fifth connecting second ports of the switches with a high pneumatic pressure, wherein the piston connected with the selected switch is driven to the extended position by the difference between the medium and high pneumatic pressures and the piston connected with the further selected switch is driven to the retracted position by the medium pneumatic pressure.

* * * * *